United States Patent
Walter

[11] Patent Number: 6,118,281
[45] Date of Patent: Sep. 12, 2000

[54] METHOD FOR DETERMINING THE SHIELDING EFFECT OF A SHIELDED CABLING PATH

[75] Inventor: Dieter Walter, Kirchheim, Germany

[73] Assignee: Siemens Aktiengesellschaft, Munich, Germany

[21] Appl. No.: 08/863,363

[22] Filed: May 27, 1997

[30] Foreign Application Priority Data

May 28, 1996 [DE] Germany .................... 196 21 401

[51] Int. Cl.[7] ............................................. G01R 31/02
[52] U.S. Cl. ............................................ 324/627; 324/539
[58] Field of Search .................... 324/627, 628, 324/539, 509

[56] References Cited

U.S. PATENT DOCUMENTS

| | | | |
|---|---|---|---|
| 2,881,389 | 4/1959 | Quine | 324/627 |
| 3,839,672 | 10/1974 | Anderson | 324/627 |
| 3,952,245 | 4/1976 | Miller | 324/627 |
| 4,425,542 | 1/1984 | Tsailovich | 324/627 |
| 4,931,720 | 6/1990 | Garbe | 324/627 |
| 5,378,992 | 1/1995 | Murphy | 324/627 |

*Primary Examiner*—Safet Metjahic
*Assistant Examiner*—Jose M. Solis
*Attorney, Agent, or Firm*—Hill & Simpson

[57] ABSTRACT

A method for determining the shielding effectiveness of a shielded and, particularly, permanently installed cabling path wherein the cabling path has an inside conductor connected via a patching cable at a first end to a transmitter which emits an electrical test signal. One pole of the transmitter output is applied to ground potential and the other pole is conductively connected to a patching cable. At a second end of the cabling path the shielding is applied to ground potential and conductively connected to the inside conductor via a terminating impedance. The shielding of the cabling path is connected to that pole of the transmitter output applied to ground potential. It is connected thereto by a return line which is connected to the first end of the cabling path at a differential current intensity of the currents flowing through the patching cable and the return line is converted into a measured value using a measuring device. Thereafter, such measured value is compared to either a theoretical reference value for a corresponding cabling path with interrupted shielding or a second measured value for the same so as to determine the associated shielding effectiveness of the cabling path.

17 Claims, 1 Drawing Sheet

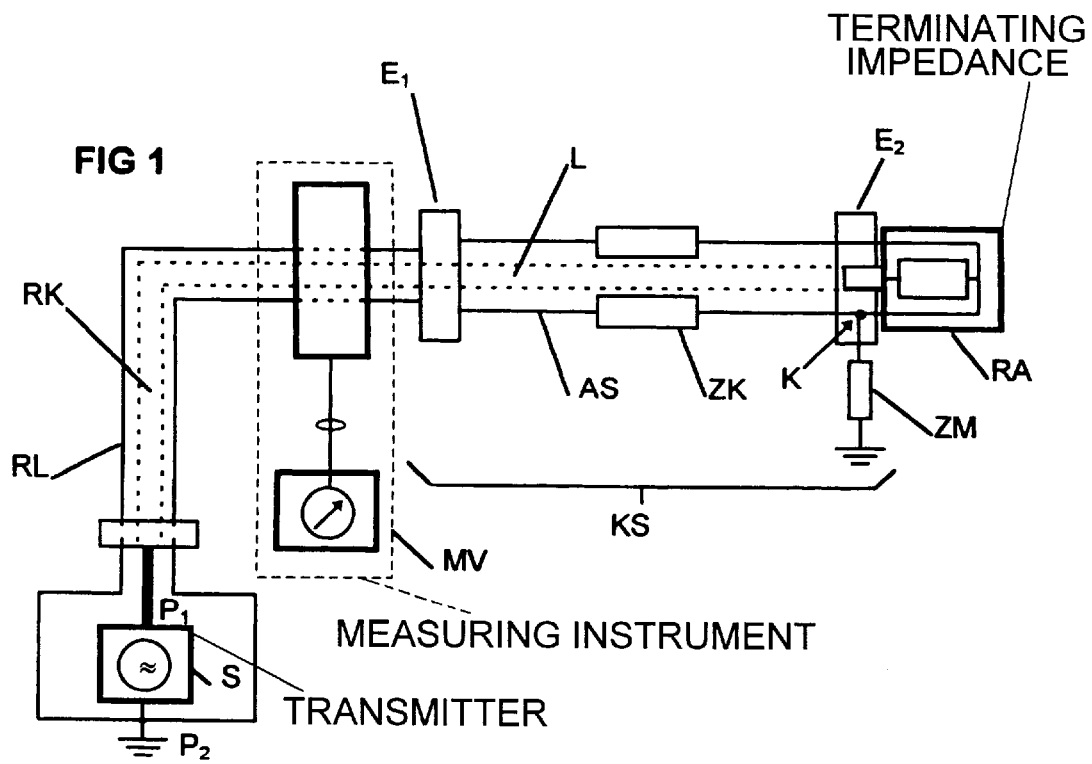
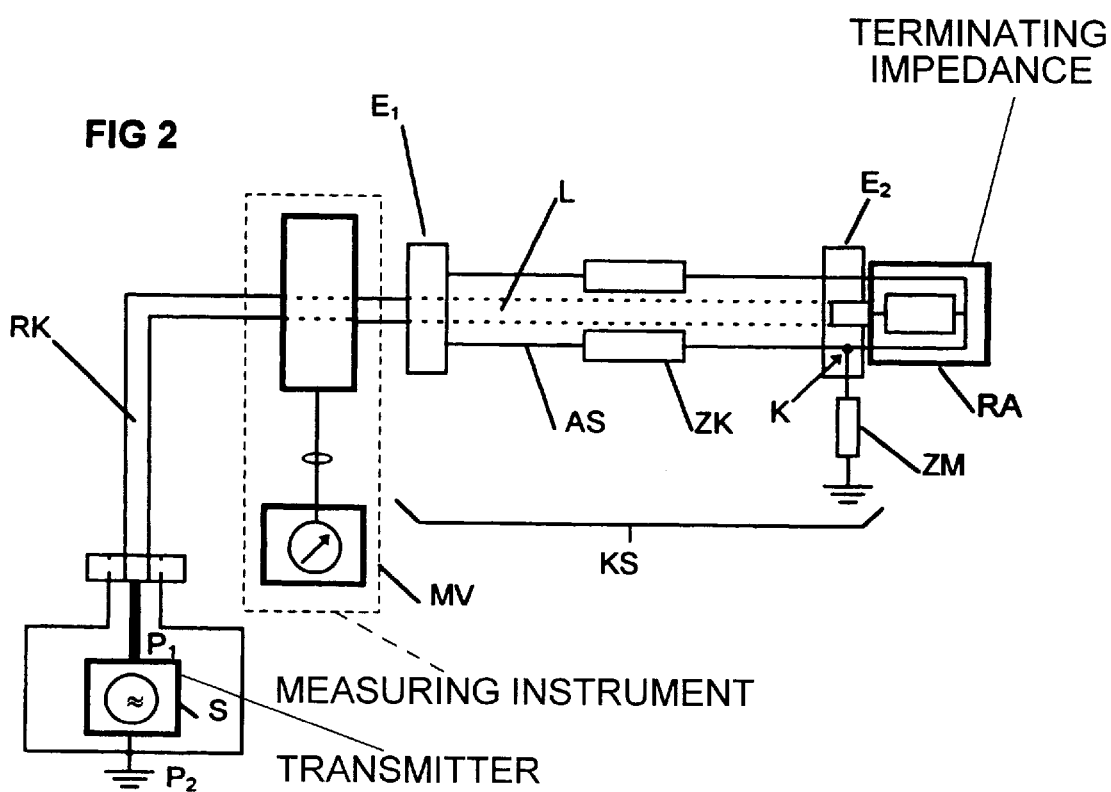

METHOD FOR DETERMINING THE SHIELDING EFFECT OF A SHIELDED CABLING PATH

BACKGROUND OF THE INVENTION

The present invention is directed to a method for determining the shielding effect of a shielded, particularly permanently installed cabling path.

Different line types are available in current technology for the various usable frequency ranges for line-bound transmission of electromagnetic signals. Lines and cables with unshielded copper wires are mainly employed in direct current and low-frequency technology. Due to the high-frequency effects that increasingly occur (skin effect, noise emission, high attenuation, reflections, etc.), such cables are no longer suitable as transmission paths for the frequency ranges used for communications and high-frequency technology. Instead, and in addition to modern light waveguides (for example, optical fiber lines), it is especially shielded cables or, respectively, wave guides (symmetrical cables and coaxial cables) that are utilized wherein a line wire (referred to below as inside conductor) is surrounded by an envelope of conductive material formed, for example, as a wire weave over an insulation layer or dielectric. A signal supplied into such a cable propagates as electromagnetic wave in the interspace of inside conductor and shielding, whereby the disturbing influences of the high-frequency effects are largely avoided, particularly the emission of energy into the space surrounding the cable.

In practice, such shielded cables are utilized, for example, in the framework of an information-technology building cabling. After the installation of the cable, measurements of the operating behavior of this transmission links according to applicable standards (for example, EN 50173) are required, particularly with respect to the electromagnetic compatibility (EMC).

Electromagnetic fields no longer occur outside an ideal coaxial shielding (or outside a concentric shielding given multi-lead cables). A real shielding, however, exhibits ohmic and inductive resistances that, when combined, are referred to as its surface transfer impedance. The quality of a shielding is thereby usually defined with reference to its surface transfer impedance. The shielding effect that can be achieved increases with lower surface transfer impedance of a shielding. The individual components, such as cable and plug connectors, of a cabling path are usually fabricated using defined measuring methods. During installation of a cabling path, however, mistakes can occur in that, for example, cable shieldings are not carefully connected to plug connectors or parts of a shielding are damaged.

The methods currently applied in practice for testing the shielding quality of an installed and, therefore usually poorly accessible cabling path are usually limited to the measurement of the D.C. resistance of the shielding, whereby frequency-dependent effects such as, for example, the reduction of the shielding effect due to inductively acting shield connections ("pig tails") cannot be detected. In addition, what are referred to as "sniffer probes" are also utilized with which radiation emerging from the shielding can be sought. A dependable and quantitative determination of the shielding quality, however, is not possible therewith.

SUMMARY OF THE INVENTION

It is an object of the present invention to provide an easily realized method with which the shielding quality of a shielded, particularly permanently installed cabling path can be dependably and quantitatively determined.

In the method of the present invention, the cabling path having one or more inside conductors and a shielding has at least one inside conductor connected via a patching cable at one end to a transmitter emitting an electrical signal. One pole of the transmitter output is applied to ground potential and the other pole is conductively connected to the patching cable (in the following, the connected inside conductors are referred to in common as "the inside conductor"). At the second end of the cabling path, the shielding is applied to ground potential and conductively connected to the inside conductor via a terminating impedance. For determining the shielding effect, the shielding of the cabling path is connected to that pole of the transmitter output applied to ground potential. It is connected thereto by a return line with prescribed impedance connected to the first end of the cabling path, and the differential current intensity, i.e. the difference in the amounts of the current intensities of the currents flowing through the patching cable and the return line, is converted into a measured value using a measuring instrument. By comparing, for example, the measured value to a theoretically acquired reference value for a corresponding cabling path with interrupted shielding, a value for the shielding effect of the cabling path is then determined from the measured value dependent on the surface transfer impedance. Under the given measuring conditions (i.e. at the frequency range employed in the measurement), the known impedance of the return line thereby exhibits either an adequately low value compared to the surface transfer impedance of the shielding of the cabling path in order to avoid a falsification of the measured results or it is appropriately taken into account in the determination of the shielding effect from the measured value.

The inventive method enables a simple, dependable, fast and quantitative measurement of the shielding effect in a shielded cabling path. Moreover, it can also be applied without limitation when, for example given a permanently installed building cabling, only the two ends of the cabling path are freely accessible. The proposed measuring method thereby only requires commercially standard measuring equipment and is suitable both for acceptance measurements as well as trouble shooting.

According to a first development of the inventive method, a second measuring procedure wherein the connection of the shielding of the cabling path to the pole of the transmitter output applied to grounded potential with a return line is eliminated and the current intensity in the patching cable is converted into a second measured value using the measuring instrument is provided in addition to the first measuring procedure. By operating the measured values for the two measuring procedures, a value for the shielding effect of the cabling path is then determined. For example, the second measured value can serve as a reference quantity to which the measured value from the first measuring procedure is placed in relationship. This relationship then represents a criterion for the shielding effect of the cabling path.

According to a second development of the inventive method, a patching cable that has a shielding and that serves as return line is employed for the first measuring procedure. A separate cable for the return line is thus superfluous.

In a third development of the invention, empirical values for the shielding effect of the shielded cabling path are determined at different signal frequencies using a variable-frequency transmitter in order to determine the frequency dependency. For example, sources of error that only occur in the environment of certain frequencies, for example in the form of resonances, can thus be found.

Particularly when sockets are connected to the ends of the cabling path such as is usually the case, for example, given building cablings, it is expedient according to another development of the invention that the terminating impedance is fashioned as a plug mating therewith.

An advantageous measuring structure derives when, according to another embodiment of the inventive method, the measurement of the difference between the current intensities in the patching cable or, respectively, the return line ensues inductively. An introduction of measuring devices into the measurement circuit is thereby superfluous. An inductive measurement is thereby especially expedient given the employment of high-frequency test signals.

The employment of a current transformer tongs is thereby especially expedient for the inductive measurement of the current intensities. In the first measuring procedure, the current transformer tongs is thereby beneficially placed around the patching cable and the return line such that the two respective currents flow through the current transformer tongs in opposite directions. As a result whereof the desired differential current intensity is automatically converted into a measured value.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawing, in which:

FIG. 1 depicts an advantageous measuring structure for the first measurement procedure; and FIG. 2. depicts the corresponding measuring structure for the second measurement procedure.

DESCRIPTION OF THE PREFERRED EMBODIMENTS

FIGS. 1 and 2 show a measuring structure for determining the shielding effect of a shielded cabling path KS with an inside conductor L and a shielding AS.

To that end, the cabling path KS has its inside conductor L connected via a patching cable RK at a first end $E_1$ to a transmitter S that emits an electrical high-frequency test signal, whereby one pole $P_2$ of the transmitter output is applied to ground potential and the other pole $P_1$ is conductively connected to the patching cable RK. At the second end $E_2$ of the cabling path KS, which is connected to a socket, the shielding As is applied to grounded potential and conductively connected to the inside conductor L via a terminating impedance RA that is fashioned as a plug mating with the socket. The surface transfer impedance ZK, which defines the quality of the shielding AS, is composed of ohmic, capacitative and inductive components.

A measuring structure according to FIG. 1 is employed for determining the shielding effect. A shielded line whose shield serves as return line RL with which the shielding AS of the cabling path KS is connected proceeding from the first end $E_1$ thereof to the pole $P_2$ of the transmitter output applied to ground potential is thereby employed as patching cable RK. The test signal output by the transmitter S runs via the inside conductor of the shielded patching cable RK and, further, via the inside conductor L of the cabling path KS. Via the terminating impedance RA, the signal at the second end of the cabling path KS proceeds to the point K at which the shielding AS is applied to grounded potential.

The impedance ZM of this connection to ground represents a first branch, and the surface transfer impedance ZK of the shielding AS together with the impedance of the return line RL represents a second branch of a voltage divider via which the test signal runs proceeding from the point K. The connection to ground thereby exhibits an impedance value ZM that usually clearly exceeds the value of the impedance of the other branch that returns to the second pole $P_2$ of the transmitter output and is essentially defined by the surface transfer impedance ZK of the cabling path KS (for example, a few 100Ω for the connection to ground compared to a few mΩ for the surface transfer impedance). When the surface transfer impedance ZK is negligibly small compared to the impedance ZM of the connection to ground, then the signal current flows from the point K nearly completely over the shielding AS and the return line and the residual current flows back to the transmitter S via ground. When, however, an elevated surface transfer impedance ZK results, for example due to damage to the shielding AS, a correspondingly higher part of the signal current flows off via the grounded line. The differential current intensity, i.e. the difference between the amounts of the current intensities of the currents flowing through the patching cable and the return line, is converted into a measured value using a current transformer tongs as measuring instrument MV that is placed around the shielded patching cable. An empirical value for the shielding effect of the cabling path KS can then be determined from this measured value, which is dependent on the surface transfer impedance ZK of the shielding AS.

A second measuring procedure having a measuring structure according to FIG. 2 can be provided in addition to the first measuring procedure. The connection of the shielding AS of the cabling path KS with a return line RL to the pole $P_2$ of the transmitter output applied to ground potential is thereby omitted. Accordingly, a line without shielding is employed as patching cable RK. Conditioned by the elimination of the return line, the entire signal current flows off via the connection to ground proceeding from the point K. This corresponds to the practical case of a shielding interruption. The current intensity in the patching cable RK is converted into a second measured value using the current transformer tongs placed around the patching cable RK. By operating the measured values for the two measurement procedures implemented with the same signal frequency, a value for the shielding effect of the cabling path is then determined. The second measured value can thereby serve, for example, as reference quantity to which the measured value from the first measuring procedure is placed into relationship, whereby this relationship represents a criterion for the shielding effect of the cabling path to be identified.

The invention is not limited to the particular details of the method depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for determining a shielding effectiveness of a shielded cabling path, the path having an inside conductor and a shielding cabling path having the inside conductor connected via a patching cable at a first end of the cable path to a transmitter that emits an electrical signal, a first pole of a transmitter output of the transmitter being applied to ground potential and a second pole of the transmitter being conductively connected to the patching cable, and, at a second end of the shielded cabling path, the shielding being applied to ground potential and conductively connected to the inside conductor via a terminating impedance, the method comprising the steps of:

connecting the shielding of the shielded cabling path to the second pole of the transmitter output by a return line, the return line having a predetermined impedance being connected to the first end of the shielded cabling path;

converting a differential current intensity of currents flowing through the patching cable and the return line into a measured value using a measuring device;

defining a theoretical reference value for a corresponding cabling path with interrupted shielding; and determining a value that is representative of the shielding effectiveness of the shielded cabling path using both the measured value and the theoretical reference value.

2. A method for determining a shielding effectiveness of a shielded cabling path, the path having an inside conductor and a shielding cabling path having the inside conductor connected via a patching cable at a first end of the cable path to a transmitter that emits an electrical signal, a first pole of the transmitter output of the transmitter being applied to ground potential and a second pole of the transmitter being conductively connected to the patching cable, and, at a second end of the cabling path, the shielding being applied to ground potential and conductively connected to the inside conductor via a terminating impedance, the method comprising the steps of:

in a first measurement procedure connecting the shielding of the cabling path to the second pole of the transmitter output by a return line, the return line having a predetermined impedance being connected to the first end of the cabling path;

in the first measurement procedure converting a differential current intensity of currents flowing through the patching cable and the return line into a measured value using a measuring device;

in a second measuring procedure omitting the connection of the shielding of the cabling path by a return line to the second pole of the transmitter output that is applied to ground potential;

in a second measurement procedure converting current intensity in the patching cable into a second measurement value using the measuring device;

in a second measurement procedure determining a value for the shielding effectiveness of the cabling path by utilizing the measured values for the first and second measuring procedures; and the patching cable for the first measuring procedure having a shielding that serves as the return line.

3. The method according to claim 1, wherein the patching cable has a shielding that serves as the return line.

4. The method according to claim 1, wherein the method further comprises determining values for the shielding effectiveness at different signal frequencies using a variable-frequency transmitter.

5. The method according to claim 1, wherein the terminating impedance is a plug.

6. The method according to claim 1, wherein the measurement of current magnitudes in the patching cable or the return line ensues inductively using the measuring device.

7. The method according to claim 6, wherein the measuring device utilizes a current transformer tongs.

8. A method for determining a shielding effectiveness of a shielded cabling path, the path having an inside conductor and a shielding cabling path having the inside conductor connected via a patching cable at a first end of the cable path to a transmitter that emits an electrical signal, a first pole of a transmitter output of the transmitter being applied to ground potential and a second pole of the transmitter being conductively connected to the patching cable, and, at a second end of the cabling path, the shielding being applied to ground potential and conductively connected to the inside conductor via a terminating impedance, the method comprising the steps of:

in a first measurement procedure connecting the shielding of the cabling path to the second pole of the transmitter output by a return line, the return line having a predetermined impedance being connected to the first end of the cabling path;

in the first measurement procedure converting a differential current intensity of currents flowing through the patching cable and the return line into a measured value using a measuring device;

in a second measurement procedure omitting the connection of the shielding of the cabling path by a return line to the second pole of the transmitter output that is applied to ground potential;

in the second measurement procedure converting current intensity in the patching cable into a second measured value using the measuring device; and in the second measurement procedure determining a value for the shielding effectiveness of the cabling path by utilizing the measured values for the first and second measuring procedures.

9. The method according to claim 8, wherein the patching cable for the first measuring procedure has a shielding that serves as the return line.

10. The method according to claim 8, wherein the method further comprises determining values for the shielding effectiveness at different signal frequencies using a variable-frequency transmitter.

11. The method according to claim 8, wherein the terminating impedance is a plug.

12. The method according to claim 8, wherein the measurement of current magnitudes in the patching cable or the return line ensues inductively using the measuring device.

13. The method according to claim 12, wherein the measuring device utilizes a current transformer tongs.

14. The method according to claim 2, wherein the method further comprises determining values for the shielding effectiveness at different signal frequencies using a variable-frequency transmitter.

15. The method according to claim 14, wherein the terminating impedance is a plug.

16. The method according to claim 14, wherein the measurement of current magnitudes in the patching cable or the return line ensues inductively using the measuring device.

17. The method according to claim 16, wherein the measuring device utilizes a current transformer tongs.

* * * * *